(12) United States Patent
Park

(10) Patent No.: US 8,164,193 B2
(45) Date of Patent: Apr. 24, 2012

(54) METAL WIRING OF SEMICONDUCTOR DEVICE AND FORMING METHOD THEREOF

(75) Inventor: Kang Tae Park, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 214 days.

(21) Appl. No.: 12/648,241

(22) Filed: Dec. 28, 2009

(65) Prior Publication Data

US 2011/0031626 A1 Feb. 10, 2011

(30) Foreign Application Priority Data

Aug. 5, 2009 (KR) .................. 10-2009-0071984

(51) Int. Cl.
*H01L 23/48* (2006.01)
*H01L 21/4763* (2006.01)

(52) U.S. Cl. . 257/763; 257/773; 257/774; 257/E23.145; 257/E21.585; 438/629

(58) Field of Classification Search .......... 438/627–629; 257/758, 762, 773, 774, E23.145, E23.157, 257/E21.585

See application file for complete search history.

(56) References Cited

U.S. PATENT DOCUMENTS

| 6,998,712 | B2 * | 2/2006 | Okada et al. .................. 257/758 |
| 7,871,921 | B2 * | 1/2011 | Park et al. ..................... 438/618 |
| 2006/0276028 | A1 * | 12/2006 | Park ............................. 438/629 |

FOREIGN PATENT DOCUMENTS

| KR | 1020060074745 A | 7/2006 |
| KR | 1020070026962 A | 3/2007 |

* cited by examiner

*Primary Examiner* — Jasmine Clark

(57) ABSTRACT

The present invention relates to a metal wiring of a semiconductor device and a method for the same, and is directed to disclose a technique forming an additional conductive layer within the metal line, which acts as an etching barrier to increase the etching margin and to improve the RC characteristics between the metal lines, which can prevent the Cu migration.

13 Claims, 4 Drawing Sheets

METAL WIRING OF SEMICONDUCTOR DEVICE AND FORMING METHOD THEREOF

CROSS-REFERENCE TO RELATED APPLICATION

The present application claims priority to Korean patent application number 10-2009-0071984 filed on Aug. 5, 2009, which is incorporated by reference in its entirety.

BACKGROUND OF THE INVENTION

The present invention relates to a method for forming a metal line of a semiconductor device, more particularly to a technology of a metal line, which is included within highly integrated semiconductors, in order to electrically connect devices or lines.

Generally, a semiconductor device is manufactured by injecting dopants into a certain region in a silicon wafer or by depositing new material on it in order to achieve given purposes. As a typical example, there is a semiconductor memory device.

A semiconductor memory device includes a number of components such as transistors, capacitors, resistors or the like in order to perform certain purposes. Each of components is connected to one another through a conductive layer to exchange data or signals.

As well known, aluminum having a very high electrical conductivity has been mainly used as a material for a metal line as well as filling material for a contact hole that provides an electrical connection between elements forming a semiconductor device.

However, as a width of the contact hole has been reduced and a depth of the contact hole has been deeper due to the increasing integration of a semiconductor device, it becomes difficult to completely fill a fine-structured contact hole with aluminum.

Therefore, in order to solve a problem of this contact hole filling, there has been proposed a technique for filling a contact hole with a metal film having a better filling characteristic than that of aluminum, for example a tungsten film, which is used as a contact plug for electrical connection between a metal line and a lower structure.

FIG. 1 is a cross-sectional view showing a conventional metal wiring of a semiconductor device.

First, a metal line 3 is formed over a semiconductor substrate 1. In addition, barrier metal layers 2, 4 are formed over and under each of metal lines. Moreover, an interlayer insulating film 5 is formed over the resulting structure including the metal line 3. In addition, the interlayer insulting film 5 is selectively etched to form a contact hole (not shown) exposing the metal line 3. After that, barrier metal layer 6 is formed on the inner surface of the contact hole (not shown). After that, the contact hole is filled with Tungsten (W), and the W material is polished by chemical mechanical polishing (CMP) until the interlayer insulating film 5 is exposed, to form a contact plug 7. In the etching process for the contact hole, the metal line 3 acts as an etching stop film.

Next, an aluminum film 9 is formed over the contact plug 7. Then, a photoresist pattern (not shown) is formed over the aluminum film 9. In addition, barrier metal layers 8, 10 are formed over and under the aluminum film 9. After that, the aluminum film 9 is etched using the photoresist pattern (not shown) as an etch barrier to form an Al line that is electrically connected to the metal line 3 via the contact plug 7. Here, the etching process for the aluminum film 9 is generally performed with a plasma etching method using a mixture gas of C12 and BC13.

Thereafter, an interlayer insulating film 11 is formed over the aluminum film 9. Moreover, the interlayer insulting film 11 is selectively etched to form a contact hole (not shown) exposing the aluminum film 9. After that, barrier metal layer 12 is formed on the inner surface of the contact hole (not shown). After that, the contact hole is filled with W material, and the W material is polished until the interlayer insulating film 11 is exposed, to form a contact plug 13. In the etching process for the contact hole, the aluminum film 9 acts as an etching stop film.

Next, as a metal line, an aluminum film 15 is formed over the entire surface including the contact plug 13. In addition, barrier metal layers 14, 16 are formed over and under the aluminum film 15.

According to the conventional method for forming a metal wiring, the metal lines 3, 9 and 15 act as the etch stop film during the etching process for a contact hole. In this case, an etching difference can occur depending upon a degree of oxide uniformity within a wafer.

That is, if the oxide uniformity within the wafer is poor, an edge part of the wafer is not etched sufficient to secure low resistance between metals, and therefore electric connection failure may occur. As a result, AC characteristics of a device, or, timing-related characteristics such as tRCD (a delay time from the time when a row address strobe signal is enabled to the time when a column address strobe signal is enabled), tRP (a pre-charge timing of a row address signal), and tWR (a write timing) can be deteriorated.

This is most likely to cause a contact failure that the metal contact is not electrically opened, and may cause problems that RC on the device characteristics and speed characteristics become degraded.

Meanwhile, as manufacturing technologies for a semiconductor device progress, there have been many efforts to put more chips in one wafer by improving integration of the semiconductor device.

This makes the minimum line-width according to design rules narrower in order to increase a degree of integration.

Also, a semiconductor device is required to operate faster and to reduce power consumption simultaneously. In order to increase integration, not only sizes of many components in a semiconductor device should be reduced, but also lengths and widths of connecting lines should be reduced.

In addition, resistance of narrow lines should be lowered in order to transmit electrical signals well through the narrow lines inside a semiconductor device. Due to this, researches have been conducted for a manufacturing method not using aluminum, but using copper, which has good electrical conductivity and lower resistance than aluminum, as a line in a semiconductor device.

However, if copper as a metal line, a method so-called "Damascene" is employed due to difficulties in etching copper compared with aluminum. The Damascene process is a technology that an insulation film is etched to form a trench, and then the trench is filled with conductive material in order to form a metal line.

On the other hand, in case of using a copper film to form a metal line, there is a merit that stability for the metal line can be secured during a following CMP process. In addition, since copper is diffused very quickly through interstitial sites, the copper is surrounded by a barrier layer so-called "diffusion stop film".

FIG. 2 is a cross-sectional view illustrating a conventional copper line.

First, an etch stop film is formed over a lower structure, such as a semiconductor substrate 50 having memory cells, through a series of semiconductor manufacturing processes. Next, an interlayer insulating film so-called Inter Layer Dielectric (ILD) or Inter Metal Dielectric (IMD) is formed over the etch stop film. Thereafter, the interlayer insulating film is selectively etched to form a trench or via-type contact hole (not shown).

Next, the contact hole is filled with conductive material such as W material to form a contact plug 51. After that, a copper line 52 which is connected to the contact plug 52 is formed thereon. Next, a contact plug 53, which is made of W, and a first metal line 54, which is made of Aluminum (Al) are formed over the copper line 52, successively. Thereafter, a contact plug 55, which is made of W, and a second metal line 56, which is made of Al are, in order, formed over the first metal line 54.

Recently, as integration increases, it becomes hard to form all metal line on the same level. Therefore, there have been proposed a technique, Multi-Layer Metallization (MLM), that increases integration by doubling or tripling metal lines using a interlayer insulating layer interposed between the metal lines. In the multi-layer metallization, upper and lower metal lines are electrically connected with each other through a contact, as shown in FIG. 2.

However, the multi-layer metallization technique may cause disconnection between inner connection lines, which may occur when the connection lines are narrower and electro migration (EM) occurs. Thus, a disconnection issue has been an important issue to solve. The EM is a phenomenon that flow of electrons makes atoms consisting of inner connection lines migrate because of the influence of Joule-Heating when current flows in the inner connection lines.

If potential difference is generated in a conductor, the electric potential will force electrons to move from a cathode to an anode while it will force atomic nucleus, a positive charge, to move to a cathode, which is referred to static electricity force.

At this moment, when electrons moving to an anode collide with the atomic nucleus, the collided atomic nucleus will get a force to move to the anode. This force is referred to electron wind force. That is, as a device is highly integrated, lines with higher current density are used in the device, and thus become vulnerable points to the EM.

Here, the degree of EM becomes different depending on a kind of a line used, line-width, thickness, contact structure, operating current density, operating temperature, and many other factors. Currently manufactured DRAMs mainly use aluminum lines, while CPUs or logic gates mainly use copper lines in order to improve reliability of a line against EM effect, reduce resistance of a line and reduce RC delay.

However, since copper has a high coefficient of thermal expansion, copper may suffer thermal expansion at a high temperature and migration can occur due to heat generated on the lower metal lines, as shown in (A) of FIG. 2. In this case, a contact failure occurs since the metal contact, connecting lower and upper metal lines, is not opened as shown in (B) of FIG. 2.

Such migration may occur mainly in interfaces between the copper and a first metal contact or between the copper and a second metal contact. Particularly, as copper ratio in the conductive layer increases, it is more likely to suffer thermal expansion, and thus migration of the copper is tend to be more intensive.

For this reason, empty spaces so-called void are generated between a metal line and a metal contact. These voids may increase resistance of copper, or may cause stress migration (SM) and the electro migration to entail a problem that lowers reliability of a device. To solve this problem, the thickness of a copper metal line can be reduced. However, in this case, since resistance of the copper will increase, there is no merit to use copper as a metal.

BRIEF SUMMARY OF THE INVENTION

Embodiments of the present invention are directed to providing an additional conductive layer within the metal line, which acts as an etching barrier to increase the etching margin and to improve the RC characteristics between the metal lines, which can prevent the Cu migration.

To achieve the purpose of the present invention, a method for forming a metal wiring of a semiconductor device of the present invention comprises: forming a first metal line over a semiconductor substrate, forming a first conductive layer over the first metal line, forming a second metal line over the first conductive layer, forming a first interlayer insulating film over the resulting structure including the second metal line, selectively etching the first interlayer insulating film and the second metal line to form a first contact hole exposing the first conductive layer, filling the first contact hole with a conductive material to form a first contact plug, and forming a third metal line over the entire surface including the first contact plug to form a first contact plug electrically connecting the first metal line and the third metal line.

Here, the present invention further comprises: forming a second conductive layer over the third metal line, forming a fourth metal line over the second conductive layer, forming a second interlayer insulating film over the resulting structure including the fourth metal line, selectively etching the fourth metal line and the second interlayer insulting film to form a second contact hole exposing the second conductive layer, filling the second contact hole with a second conductive material to form a second contact plug, and form a fifth metal line over the entire surface including the second contact plug to form a second plug electrically connecting the third metal line and the fifth metal line.

In addition, the first metal line and the second metal line are preferably made from a material including Cu or Al. Preferably, the first contact plug is mad of a Tungsten (W) material. Also, the first conductive layer is preferably made from a material including one selected from the group consisting of W, Ag or Au.

Moreover, a metal wiring of a semiconductor device according to the present invention comprises: a first metal line formed over a semiconductor substrate, a first conductive layer formed over the first metal line, a second metal line formed over the first conductive layer, a first interlayer insulating film formed over the resulting structure including the second metal line, a third metal line formed over the first interlayer insulating film, and a first contact plug passing through the second metal line and the first interlayer insulating film to electrically connect the first metal line and the third metal line.

Here, the metal wiring further comprises: a second conductive layer formed over the third metal line, a fourth metal line formed over the second conductive layer, a second interlayer insulating film formed over the resulting structure including the fourth meta line, a fifth metal line formed over the second interlayer insulating film, and a second contact plug passing through the fourth metal line and the second interlayer insulating film to electrically connect the third metal line and the fifth metal line.

In addition, the first metal line and the second metal line are preferably made from a material including Cu or Al. Preferably, the first contact plug is mad of a W material.

Also, the first conductive layer is preferably made from a material including one selected from the group consisting of W, Ag or Au.

DESCRIPTION OF EMBODIMENTS

The following explains in details embodiments of the present invention in referencing with the drawings, but the present invention is not limited thereto.

Figure 1:
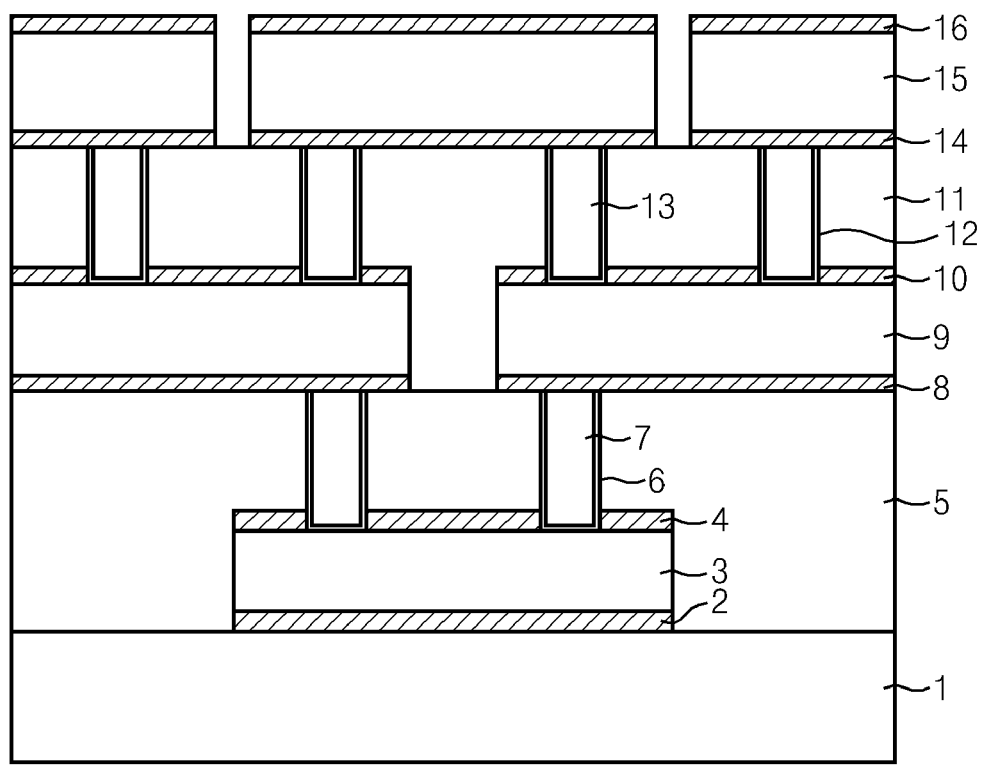
FIGS. 1 and 2 are cross-sectional views showing conventional metal lines for a semiconductor device, respectively.
Figure 2:
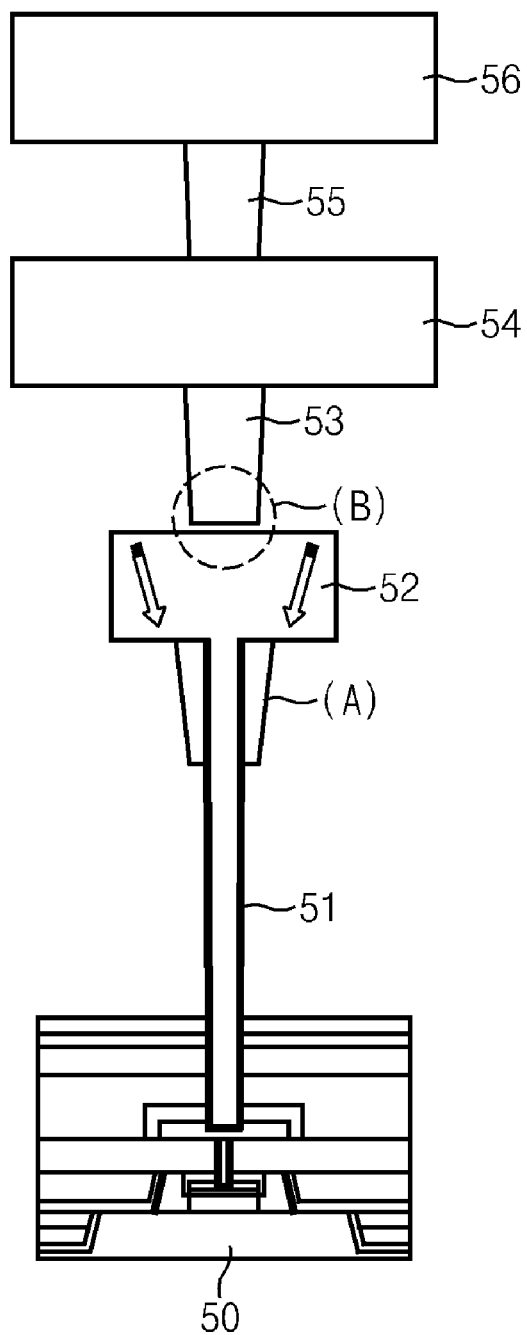
Figure 3:
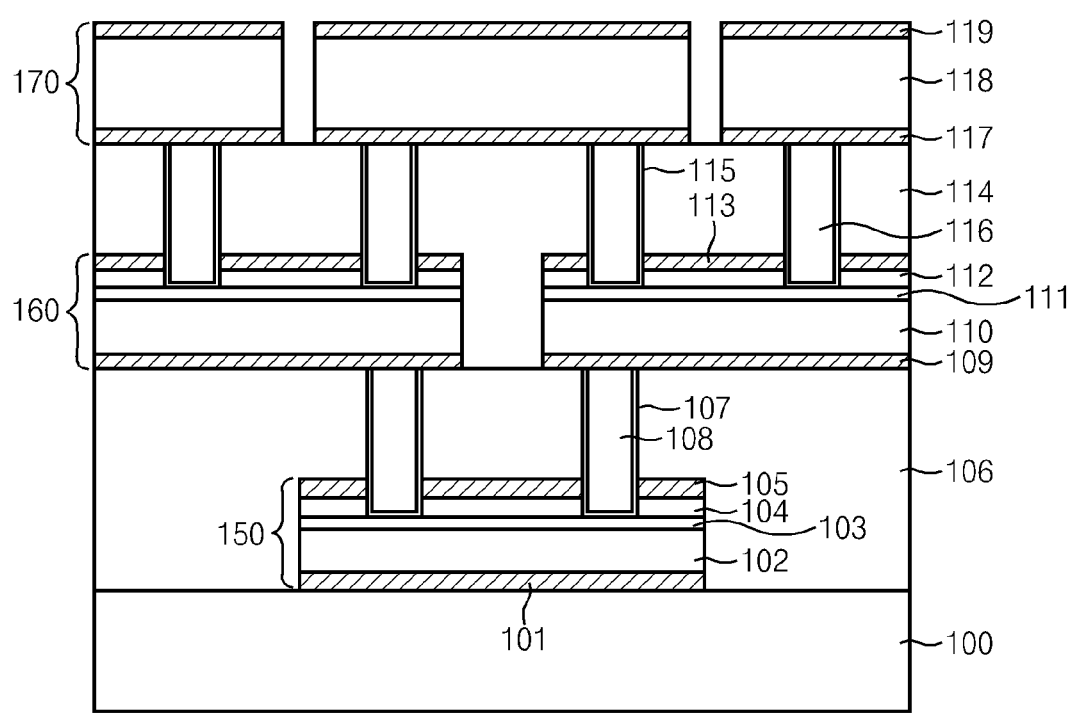
FIGS. 3 and 4 are cross-sectional views showing a metal line for a semiconductor device according to the present invention.

FIG. 3 is a cross-sectional view illustrating a method for forming a metal wiring of a semiconductor device according to the present invention.

The present invention has a stack structure including a first metal layer 150, a second level of metal layer 160 and a third metal layer 170. The metal layers are electrically connected to each other via contact plugs 108, 116. In addition, barrier metal layers 101, 105, 109, 113, 117 and 119 are formed over and under each of metal lines.

Here, first and second metal lines 102, 104, third and fourth metal lines 110, 112, and a fifth metal line 118 are made of material including Cu or Al, respectively.

First, a first metal layer 102 is formed over a semiconductor substrate 100. After that, a first conductive layer 103 is formed over the first metal line 102, and a second metal line 104 is formed over the first conductive layer 103. In addition, an interlayer insulating film 106 is formed over the resulting structure including the first level of metal layer 150.

Moreover, the interlayer insulting film 106 and the second metal line 104 are selectively etched to form a contact hole (not shown) exposing the first conductive layer 103. After that, barrier metal layer 107 is formed on the inner surface of the contact hole (not shown). After that, the contact hole is filled with a conductive material, and the conductive material is polished by chemical mechanical polishing (CMP) until the interlayer insulating film 106 is exposed, to form a first contact plug 108. In the etching process for the contact hole, the first conductive layer 103 acts as an etching stop film.

Here, the conductive material for filling the contact hole is preferably made of W. In addition, the first conductive layer 103 is preferably made of the same material as the first contact plug 108, for example, W material. Also, the first conductive layer 103 may be made of material including Ag or Au.

Next, a third metal line 110 is formed over the interlayer insulating film 106 with interposing the first contact plug 108. After that, a second conductive layer 111 is formed over the third metal line 110. In addition, the second conductive layer 111 is preferably made of the same material as the first contact plug 108, for example, the W material. In addition, the second conductive layer 111 may be made of a material including Ag or Au.

Further, a forth metal line 112 is formed over the second conductive layer 111. In addition, an interlayer insulating film 114 is formed over the entire surface of the resulting structure including the second level of metal layer 160. Moreover, the interlayer insulting film 114 and the metal line 112 are selectively etched to form a contact hole (not shown) exposing the second conductive layer 111. After that, the contact hole is filled with conductive material, and the conductive material is polished by CMP until the interlayer insulating film 114 is exposed, to form a second contact plug 116. In the etching process for the contact hole, the second conductive layer 111 acts as an etching stop film.

Here, the conductive material for filling the contact hole is preferably made of W-containing material. In addition, the second conductive layer 111 is preferably made of the same material as the second contact plug 116, for example, W-containing material. Also, the second conductive layer 111 may be made of material including Ag or Au.

Next, a fifth metal line 118 is formed over the interlayer insulating film 114 and the second contact plug 116.

Thus, in the present invention, the conductive layers 103 and 111 are formed within the first and second metal lines 102, 104 and the third and forth metal lines 110, 112, respectively, and the conductive layers 103 and 111 are used as etching barriers, respectively. In this case, the conductive layer 103 or 111 is made of the same material as the contact plug 108 or 116, thereby securing an etching margin.

In addition, since the first and second metal line layers 102, 104 and the third and forth metal line layer 110, 112 are electrically connected to each other, and formed of the same material, the uniformity in the wafer can be enhanced and resistance and RC between the metals can be reduced.

Figure 4:
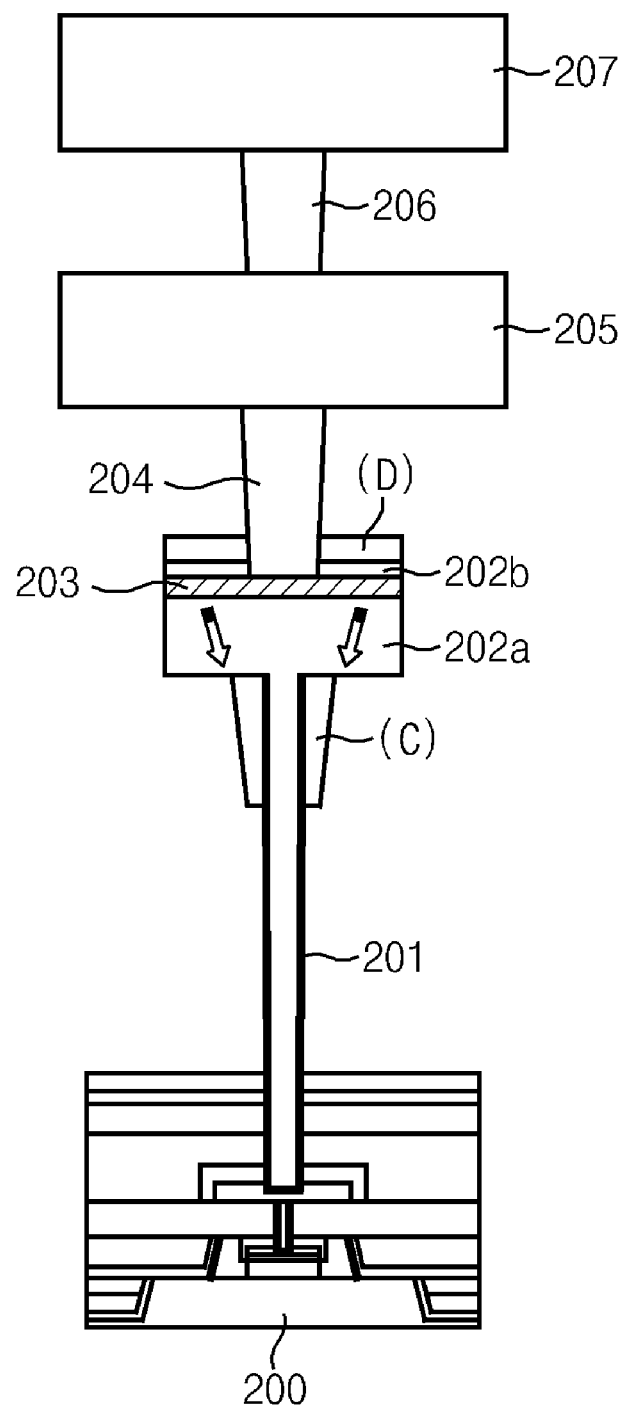

FIG. 4 is another example of a method for forming a metal wiring of a semiconductor device according to the present invention.

First, an etching stop film is formed over a semiconductor substrate 200. After that, an interlayer insulating film (not shown) is formed on the etching stop layer, in which the interlayer insulating film includes the inter layer dielectric (ILD) or inter metal dielectric (IMD) layer.

Next, the interlayer insulating film is selectively etched to form a contact hole (not shown) in the shape of trench or via. Thereafter, the contact hole is filled with conductive material, that is, W-containing material to form a contact plug 201.

After that, a metal line 202a is formed over the entire surface including the contact plug 201, in which the metal line 202a is electrically connected to the contact plug 201. Here, the metal line 202a is preferably made of Copper (Cu) material.

Next, a conductive layer 203 is formed over the metal line 202a. A metal line 202b is then formed over the conductive layer 203.

Subsequently, an interlayer insulating film (not shown) is formed over the metal line 202b, and is selectively etched to form a contact hole (not shown). At this time, during the etching process for the contact hole, the conductive layer 203 acts as an etching barrier.

Next, the contact hole is filled with a conductive material to form a contact plug 204. At this point, the contact plug 204 is preferably made of the same material as the conductive layer 203, for example, a W material. In addition, the conductive layer 203 may be made of a material including Ag or Au.

After that, a metal line 205, a contact plug 206 and a metal line 207 are successively formed over the entire surface including the contact plug 204. Preferably, the metal lines 205 and 207 are made of Aluminum (Al)-containing material, and the contact plug 206 is made of W material. Preferably, the formation process of the metal line 205, the contact plug 206 and the metal line 207 may be similar as that of the metal line 202a and the contact plug 204.

However, there is a phenomenon that the Cu migration occurs due to the thermal influence of the lower metal lines during a high temperature thermal expansion of Cu that has a high coefficient of thermal expansion, as shown in (C).

Since, in the present invention, there is the conductive layer 203 between the metal lines 202a and 202b, which is connected to the contact plug 204, even if the Cu migration occurs, the contact failure between the higher and lower metal lines would not happen, as shown in (D) of FIG. 4.

The present invention provides additional a metal layer within the metal line, which acts as an etching barrier to increase the etching margin and to improve the RC between the metal lines, which can prevent the Cu migration. As a result, there is an effect to improve the yield of a device as well as its overall characteristics.

The above-described embodiments of the present application are intended to be examples only. Alterations, modifications, substitutions and additions may be effected to the particular embodiments by those skilled in the art without departing from the spirit and scope of the application, which is defined by the claims appended hereto. Such alterations or modifications are intended to fall within the scope of the appended claims.

What is claimed is:

1. A method for forming a metal wiring for a semiconductor device, the method comprising:
   forming a first level of metal layer over a semiconductor substrate,
   forming a second level of metal layer over the first level of metal layer;
   forming a first contact plug electrically coupling the first and the second levels of metal layers;
   forming a third level of metal layer over the second level of metal layer; and
   forming a second contact plug electrically connecting the second level of metal layer and the third level of metal layer,
   wherein the first level of metal layer includes:
      a first metal line formed over the semiconductor substrate;
      a first conductive layer formed over the first metal line; and
      a second metal line formed over the first conductive layer.

2. The method of claim 1, wherein the second level of metal layer includes:
   a third metal line;
   a second conductive layer formed over the third metal line; and
   a fourth metal line formed over the second conductive layer.

3. The method of claim 1, wherein the first and the second metal line include the same material.

4. The method of claim 1, wherein the first contact plug includes conductive material different from either the first or the second metal line.

5. The method of claim 1, wherein each of the first metal line and the second metal line includes Cu or Al.

6. The method of claim 1, wherein the first contact plug includes tungsten (W).

7. The method of claim 1, wherein the first conductive layer includes at least one selected from the group consisting of W, Ag and Au.

8. A semiconductor device, comprising:
   a first level of metal layer formed over a semiconductor substrate;
   a second level of metal layer formed over the first level of metal layer;
   a first contact plug electrically coupling the first and the second level of metal layers;
   a third level of metal layer formed over the second level of metal layer; and
   a second contact plug electrically coupling the second and the third level of metal layers,
   wherein the first level of metal layer includes:
      a first metal line formed over the semiconductor substrate;
      a first conductive layer formed over the first metal line; and
      a second metal line formed over the first conductive layer.

9. The semiconductor device of claim 8, wherein the second level of metal layer includes:
   a third metal line electrically coupled to the first contact,
   a second conductive layer formed over the third metal line; and
   a fourth metal line formed over the second conductive layer.

10. The semiconductor device of claim 8, wherein each of the first metal line and the second metal line includes Cu or Al.

11. The semiconductor device of claim 8, wherein the first contact plug includes Tungsten.

12. The semiconductor device of claim 8, wherein the first conductive layer includes at least one selected from the group consisting of W, Ag and Au.

13. A semiconductor device, comprising:
   a first level of metal layer formed over a semiconductor substrate;
   a second level of metal layer formed over the first level of metal layer; and
   a first contact plug electrically coupling the first and the second level of metal layers,
   wherein the first level of metal layer includes:
      a first metal line formed over the semiconductor substrate;
      a first conductive layer formed over the first metal line; and
      a second metal line formed over the first conductive layer, and
   wherein the first contact plug extends into the first level of metal layer and is coupled to the first conductive layer.

* * * * *